(12) United States Patent
Sone

(10) Patent No.: US 7,597,257 B2
(45) Date of Patent: Oct. 6, 2009

(54) OVERHEAD TRAVELING VEHICLE AND SYSTEM THEREFOR

(75) Inventor: Hiroki Sone, Kakamigahara (JP)

(73) Assignee: Murata Kikai Kabushiki Kaisha, Kyoto-shi (JP)

( * ) Notice: Subject to any disclaimer, the term of this patent is extended or adjusted under 35 U.S.C. 154(b) by 423 days.

(21) Appl. No.: 11/406,420

(22) Filed: Apr. 19, 2006

(65) Prior Publication Data

US 2006/0237525 A1 Oct. 26, 2006

(30) Foreign Application Priority Data

Apr. 20, 2005 (JP) ............... 2005-122462

(51) Int. Cl.
*G06F 19/00* (2006.01)
(52) U.S. Cl. .................................... 235/385
(58) Field of Classification Search .............. 235/375, 235/385
See application file for complete search history.

(56) References Cited

U.S. PATENT DOCUMENTS 4,570,058 A * 2/1986 Havassy ................. 235/479
5,441,158 A * 8/1995 Skinner .................. 209/583
5,536,128 A * 7/1996 Shimoyashiro et al. .... 414/273

FOREIGN PATENT DOCUMENTS

| JP | 60-259341 | 12/1985 |
| JP | 2002-182743 A | 6/2002 |
| JP | 2002-261150 A | 9/2002 |

OTHER PUBLICATIONS

Japanese Office Action dated Jul. 3, 2008, issued in corresponding Japanese Patent Application No. 2005-122462.

* cited by examiner

*Primary Examiner*—Jamara A Franklin
(74) *Attorney, Agent, or Firm*—Westerman, Hattori, Daniels & Adrian, LLP.

(57) ABSTRACT

An ID reader 53 is provided at a fall prevention cover 50 of an overhead traveling vehicle 20 for reading an ID 76 on the back surface of an article 70. The ID reader 53 can be protruded from or retracted into the fall prevention cover 50. When the article 70 is elevated/lowered, the ID reader is retracted into the cover 50. When the ID 76 is read, the ID reader 53 is advanced to a position under the article 70.

3 Claims, 7 Drawing Sheets

Fig. 9

| BUFFER ID | OCCUPIED /VACANT | ID | From | To | STATE | TIME OF RETRIEVAL /STORAGE | OVERHEAD TRAVELING VEHICLE | INVENTORY CHECK |
|---|---|---|---|---|---|---|---|---|
| STB1 | OCCUPIED | XYZ | ABC | DEF | UNASSIGNED | abcd | stu | FINISHED |
| STB2 | VACANT | | | | UNASSIGNED | bcde | tuv | NOT FINISHED |
| UTB1 | OCCUPIED | SKT | FGM | NHK | ASSIGNED | cefg | kuh | NOT FINISHED |

90

OVERHEAD TRAVELING VEHICLE AND SYSTEM THEREFOR

TECHNICAL FIELD

The present invention relates to an overhead traveling vehicle and a system for the overhead traveling vehicle. In particular, the present invention relates to reading of an ID of an article for transportation.

BACKGROUND ART

The overhead traveling vehicle travels along a traveling rail for transporting an article to/from a processing apparatus, a stocker, or a buffer, etc. Since the overhead traveling vehicle does not have any ID reader, it is not possible to confirm the ID of the article. Therefore, tracking is necessary to accurately check how the transportation command is being executed. In the following description, the term "From" position means the loading position of the article, and the term "To" position means the unloading position of the article. In order to confirm the ID of the article transferred from the "From" position to the "To" position, reporting of the ID is requested to an ID reader fixed at the "From" position on the ground, and the ID needs to be reported from an ID reader fixed at the "To" position on the ground. In most cases, the ID readers are controlled by controllers other than the overhead traveling vehicle controller, such as a production controller and a stocker controller. Therefore, the ID needs to be received through a plurality of controllers. In order to avoid the problem, it is preferable that the overhead traveling vehicle has an ID reader. However, in general, the ID is attached to the back surface of the article. Therefore, the ID reader obstructs operation of elevating/lowering the article.

SUMMARY OF THE INVENTION

An object of the present invention is to make it possible to read an ID of an article without obstructing transfer of the article or traveling of an overhead traveling vehicle.

A secondary object of the present invention is to make it possible to reliably read an ID of an article without obstructing transfer of the article.

Further, an object of the present invention is to make it possible to assign a transportation command to an overhead traveling vehicle before an article retrieved to a load port is determined.

According to the present invention, an overhead traveling vehicle has a hoisting frame holding an article with an ID, and transports the article along a traveling rail. The overhead traveling vehicle comprises an ID reader for reading the ID, and moving means for moving the ID reader between a reading position for reading the ID and a retracted position.

Preferably, the moving means moves the ID reader between a reading position in a transfer route of the article and a retracted position outside the transfer route of the article.

In particular, preferably, the moving means moves the ID reader between the inside and the outside of an elevating/lowering route of the article.

More preferably, when the article is held with the hoisting frame, and pulled into the overhead traveling vehicle, the moving means moves the ID reader to the reading position for reading the ID of the article. In the structure, since the ID reader can read the ID of the article which is pulled into the overhead traveling vehicle, even if the load port or the buffer storing the article is remotely positioned from the overhead traveling vehicle, it is possible to read the ID correctly.

More preferably, a pair of covers having fall prevention pieces for preventing the article from being dropped are provided on the front and back sides of the overhead traveling vehicle in a traveling direction. The ID reader is supported by one of the covers such that the ID reader is hidden by the one of the covers in the retracted position, and, in the reading position, protruded from the one of the covers to be arranged near the center position of the overhead traveling vehicle in the traveling direction. In the structure, the ID reader can be provided utilizing the cover.

Most preferably, fall prevention means movable between an operating position under the article and a retracted position which does not overlap with the article in a plan view is provided, and a drive mechanism for the fall prevention means is also used as the moving means for moving the ID reader.

According to the present invention, an overhead traveling vehicle system comprises a traveling rail for allowing an overhead traveling vehicle to travel along the traveling rail, a load port used for transferring an article with an ID to/from the overhead traveling vehicle, and a controller for controlling the overhead traveling vehicle. The overhead traveling vehicle comprises an ID reader for reading the ID, and means for moving the ID reader between a reading position for reading the ID and a retracted position. The controller comprises reservation assignment means for designating a transportation departure point without designating a transportation destination point, requesting the overhead traveling vehicle to travel to the transportation departure point, and notifying the transportation destination point to the overhead traveling vehicle based on reception of the ID of the article read by the overhead traveling vehicle at the transportation departure point.

Preferably, the controller further comprises means for storing a list of IDs of articles, transportation departure points, and transportation destination points. The reservation assignment means designates the transportation departure point in the list without designating the transportation destination point, requests the overhead traveling vehicle to travel to the transportation departure point, and notifies the transportation destination point in the list to the overhead traveling vehicle based on reception of the ID of the article read by the overhead traveling vehicle at the transportation departure point. in the structure, it is possible to control reservation assignment easily.

It is not necessary to provide the ID readers for all of the overhead traveling vehicles in the system. The system may include both of the overhead traveling vehicle without the ID reader, and the overhead traveling vehicle with the ID reader.

In the present invention, since it is possible to read the ID of the article by the overhead traveling vehicle, tracking in transportation operation becomes unnecessary or easy. At the time of restoring the system from the state where a system down has occurred, or abnormal data has been found, it is possible to easily confirm the positions of the articles. Therefore, the restoration is easy. Further, in the case of providing a large number of simple buffers along the traveling rail, inventory check of articles on the buffers can be carried out.

By making it possible to reliably read the ID without obstructing transfer operation of the article, both of transfer of the article and reading of the ID can be carried out. At this time, by reading the ID after moving the ID reader to a position near the ID, it is possible to reliably read the ID.

By making it possible to assign a transportation command to the overhead traveling vehicle before the article retrieved to the load port is determined, it is possible to make reservation assignment of the transportation command to the overhead traveling vehicle. In the conventional case, at the stage where the ID of the article has not been determined, it is difficult to make assignment of the transportation command. Assuming that a transportation command is assigned based on expectation, even if an article which is different from the expected article is retrieved, since the overhead traveling vehicle does not have any means for checking the fact, the overhead traveling vehicle transports the different (wrong) article. As a result, for example, the article may be lost undesirably. However, in the present invention, the transportation departure point ("From" position) is designated so that the overhead traveling vehicle can travel to the designated transportation departure point. After the overhead traveling vehicle confirms the ID of the article, the transportation destination point ("To" position) is designated. Therefore, the overhead traveling vehicle can travel to the load port rapidly, and transport the article rapidly.

BRIEF DESCRIPTION OF THE DRAWINGS

FIG. 9 is a table schematically showing inventory data in a buffer of a controller according to the embodiment.

Figure 1:
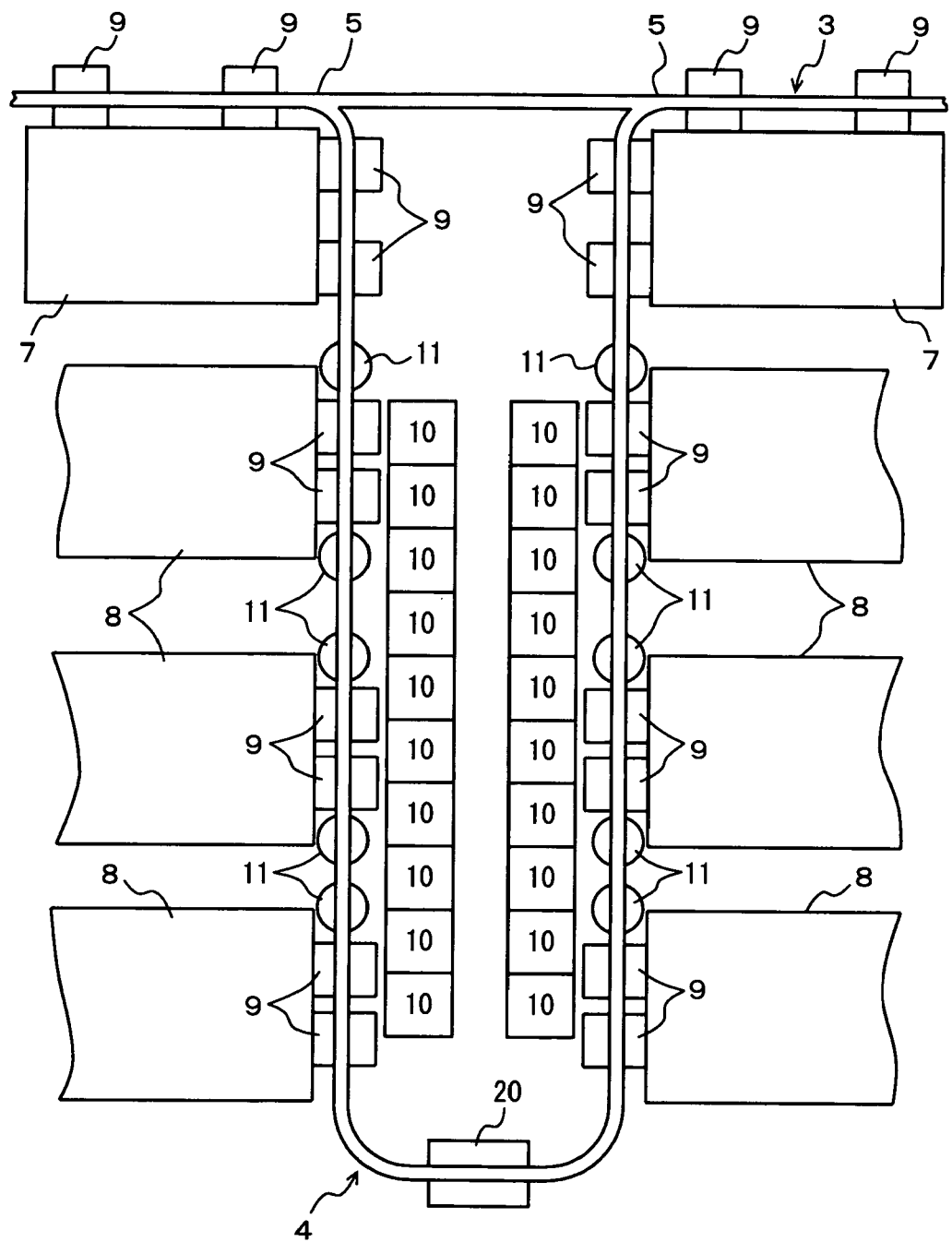
FIG. 1 is a plan view showing the layout of main components in an overhead traveling vehicle system.

| Brief Description of the Symbols | |
|---|---|
| 2 | Overhead traveling vehicle system |
| 3 | Inter-bay route |
| 4 | Intra-bay route |
| 5 | Branch portion |
| 7 | Stocker |
| 8 | Processing apparatuses |
| 9 | Load port |
| 10 | Side buffer |
| 11 | Lower buffer |
| 20 | Overhead traveling vehicle |
| 24 | Logistics controller |
| 25 | Production controller |
| 26 | Stocker controller |
| 27 | Overhead traveling vehicle controller |
| 28 | Local controller |
| 30 | Traveling rail |
| 31 | Power feeding rail |
| 35, 36, 37 | Pillar |
| 40 | Traveling unit |
| 41 | Power receiving unit |
| 42 | Body frame |
| 45 | Lateral feeding unit |
| 46 | θ drive |

| Brief Description of the Symbols -continued | |
|---|---|
| 47 | Elevation drive unit |
| 48 | Hoisting frame |
| 50, 51 | Fall prevention cover |
| 52 | Fall prevention piece |
| 53 | ID reader |
| 55, 56 | Article sensor |
| 57 | Drive unit |
| 58 | Display unit |
| 60 | Arm |
| 61 | Rotation motor |
| 62 | Crank |
| 63 | Linking arm |
| 64 | Fulcrum shaft |
| 65 | Drive shaft |
| 66, 67 | Gear |
| 70 | Article |
| 72 | Lid |
| 74 | Flange |
| 76 | ID |
| 80 | Stacker crane |
| 90 | Inventory file |

EMBODIMENT

FIGS. 1 to 9 show an overhead traveling vehicle system 2 and an overhead traveling vehicle 20 according to an embodiment. For example, the overhead traveling vehicle system 2 is provided in a clean room of a semiconductor factory or the like. An inter-bay route 3 is provided for connecting remote bays (processes). Each bay has an intra-bay route 4. The routes 3, 4 are branched or joined at branch portions 5. Each of the routes 3 and 4 comprises a traveling rail. Reference numerals 7 denote stockers provided along the border between the routes 3 and 4. If buffers 10, 11 as described later have large capacity, the stockers 7 may not be provided.

Processing apparatuses 8 such as semiconductor processing apparatuses are connected to the intra-bay route 4. Reference numerals 9 denote load ports provided for the processing apparatuses 8 and the stockers 7. The load ports 9 are provided just below the routes 3 and 4. Side buffers 10 are provided in an overhead space on the side of the route 4. In an overhead space under the routes 3 and 4, lower buffers 11 are provided at positions where the load ports 9 are not provided. The overhead traveling vehicle 20 travels along the routes 3 and 4, and transfers the articles between the load ports 9, 9.

Figure 2:
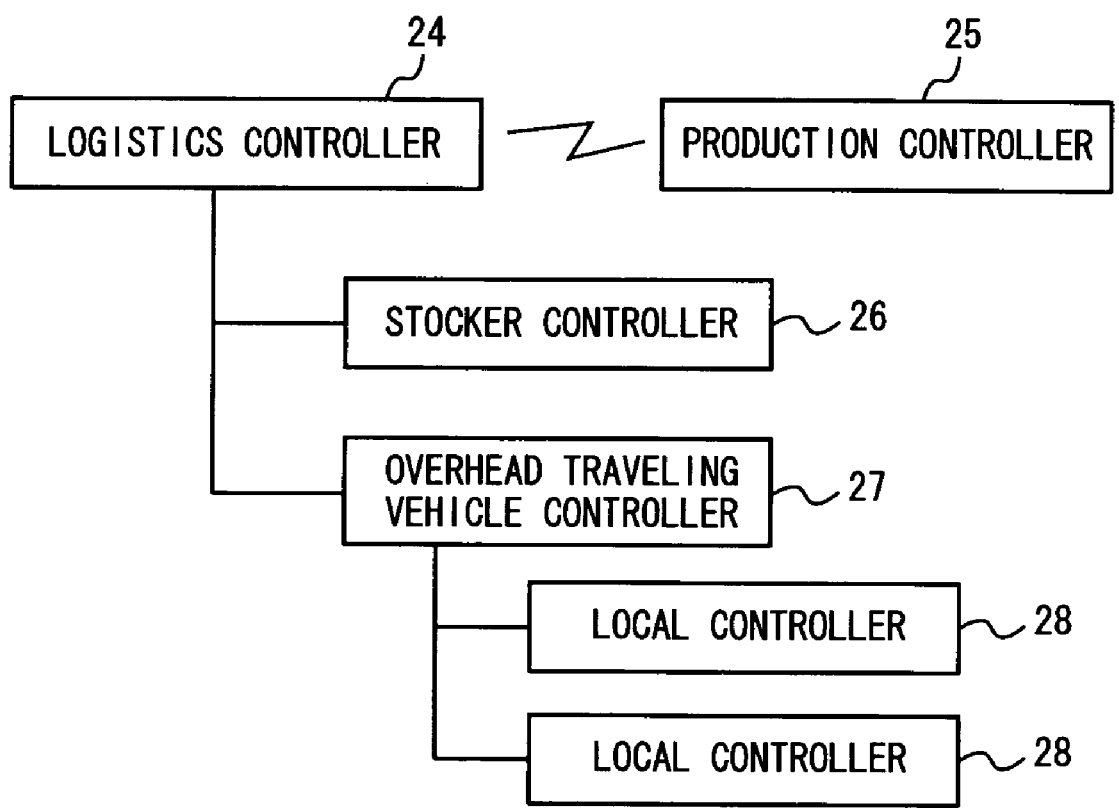
FIG. 2 is a block diagram showing arrangement of controllers in the overhead traveling vehicle system.

FIG. 2 shows a control system of the overhead traveling vehicle system 2. A reference numeral 24 denotes a logistics controller for controlling the entire transportation system such as the overhead traveling vehicle system and the stockers. A stocker controller 26 controls the stockers, and an overhead traveling vehicle controller 27 controls the overhead traveling vehicle system. A plurality of local controllers 28 are provided as sub-controllers of the overhead traveling vehicle controller 27. The overhead traveling vehicle system is managed by the unit of the intra-bay route 4 or the like. A reference numeral 25 denotes a production controller for controlling production by the processing apparatus or the like. The production controller 25 designates IDs, transportation departure points (FROM), and transportation destination points (TO) of the articles for requesting the logistics controller 24 to transport the articles. Controllers may be provided at more levels.

Figure 3:
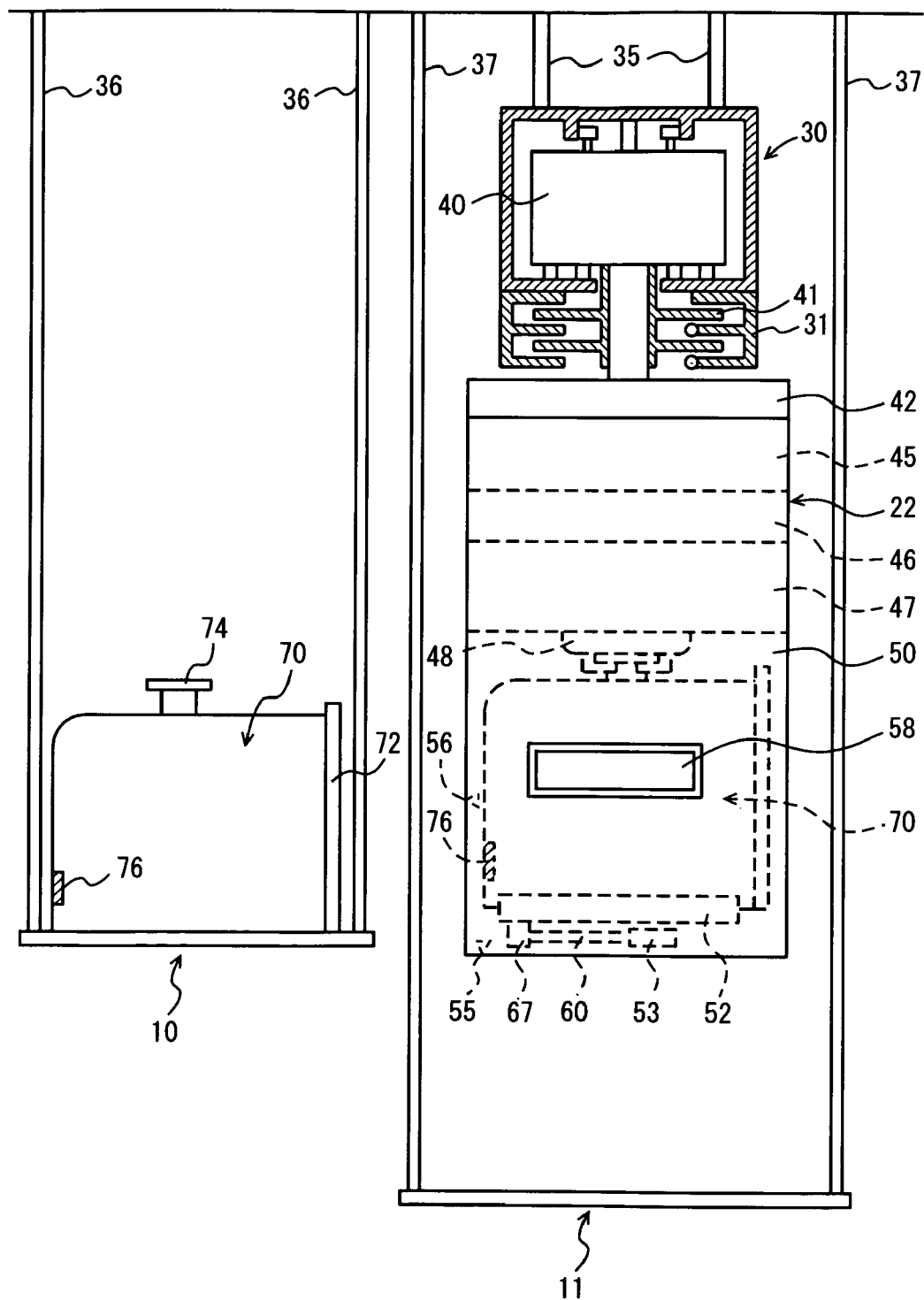
FIG. 3 is a front view, with partial cutout, showing an overhead traveling vehicle according to an embodiment, and a side buffer and a lower buffer provided around the overhead traveling vehicle.
Figure 4:
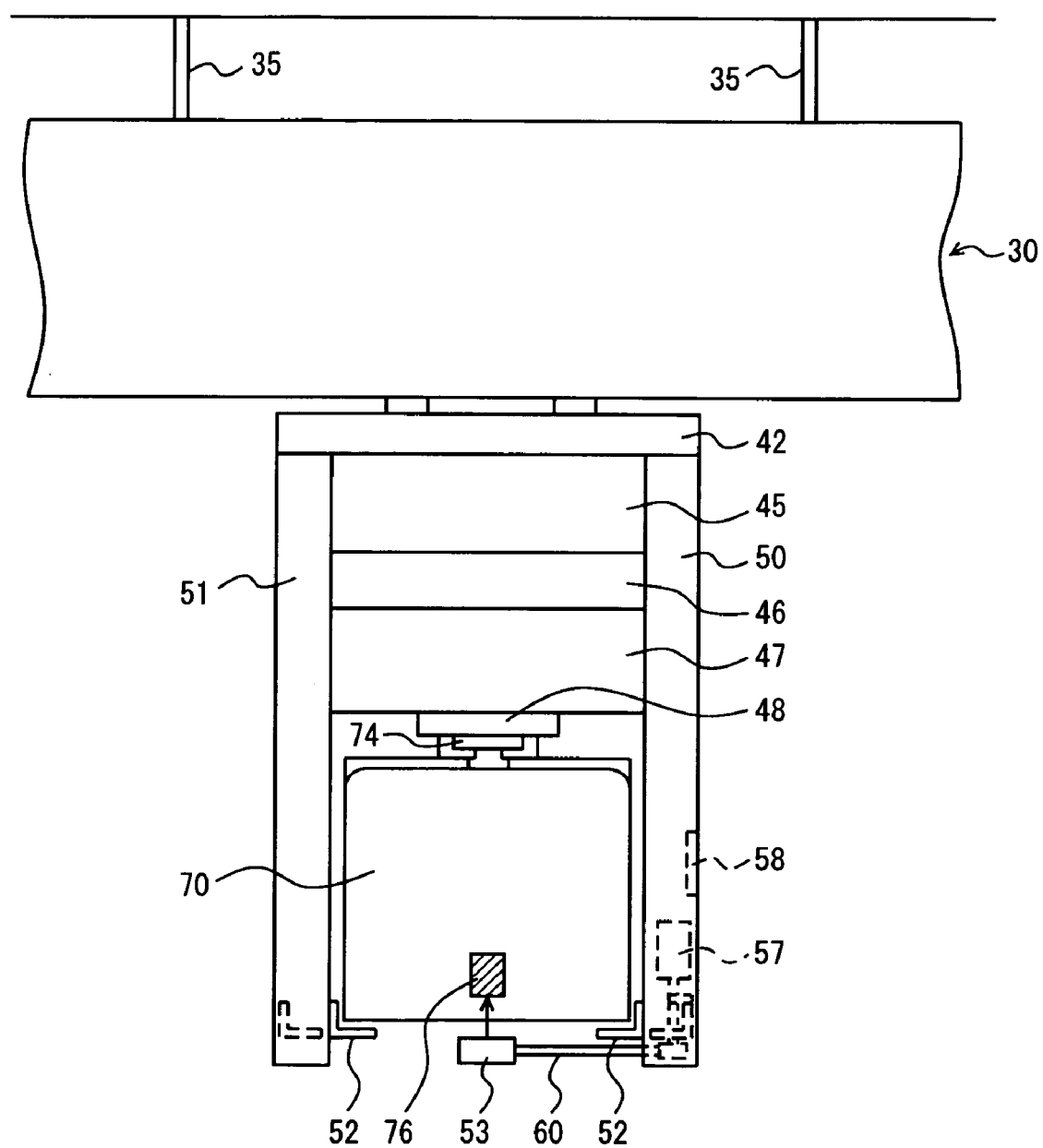
FIG. 4 is a view schematically showing operation of reading an article ID by the overhead traveling vehicle according to the embodiment.

As shown in FIGS. 3 and 4, a traveling rail 30 is provided in an overhead space. For example, a power feeding rail 31 is provided under the traveling rail 30. Reference numerals 35 denote pillars of the traveling rail 30. Reference numerals 36, 37 denote pillars of the buffers 10, 11. A traveling unit 40 of the overhead traveling vehicle 20 travels inside the traveling rail 30. A power receiving unit 41 receives electricity from a litz wire provided in the power feeding rail 31 in a non-contact manner. Further, communication is performed using the litz wire. A reference numeral 42 denotes a body frame, a reference numeral 45 denotes a lateral feeding unit, and a reference numeral 46 denotes a 0 drive. The 0 drive 46 may not be provided. A reference numeral 47 denotes an elevation drive unit for elevating/lowering a hoisting frame 48. Fall prevention covers 50, 51 are provided on the front and back sides of the overhead traveling vehicle 20. Reference numerals 52 denote fall prevention pieces. The fall prevention pieces 52 is retractable into the bottom of the fall prevention covers 50, 51 for preventing the article 70 from being dropped undesirably. Further, article sensors 55, 56 are provided at the fall prevention cover 50 or the like for detecting the presence of the articles 70 on the buffers 10, 11, and the load ports 9.

The lateral feeding unit 45 laterally feeds the 0 drive 46, the elevation drive unit 47, and the hoisting frame 48 toward the left side in FIG. 3 such that the article 70 can be transferred to/from the side buffer 10 provided on the left side of the traveling rail 30. The lateral feeding unit 45 may be capable of laterally feeding the 0 drive 46, the elevation drive unit 47, and the hoisting frame 48 toward only one of the left and right sides, or toward both of the left and right sides. The 0 drive 46 rotates the elevation drive unit 47 in a horizontal plane so that the transfer of the article 70 becomes easy.

A reference numeral 53 denotes an ID reader for reading an ID 76 of the article 70. The ID reader 53 is attached to one of the fall prevention covers 50, 51, i.e., the fall prevention cover 50. The ID reader 53 is retractable into the fall prevention cover 50 by an arm 60. The ID reader 53 can move between a position where the ID reader 53 is hidden in the bottom of the fall prevention cover 50, and a position where the ID reader 53 is placed under the article 70, at the center in the front-back direction, and near the back surface of the article 70 in the left-right direction. The arm 60 rotates synchronously with protrusion/retraction of the fall prevention pieces 52 by a drive unit 57. A reference numeral 58 denotes a display unit provided on the fall prevention cover 50 or the like. The display unit 58 displays, for example, the state of the overhead traveling vehicle 20, and the read ID 76 of the article 70.

For example, the article 70 is a semiconductor cassette. An openable lid 72 is provided on the front surface of the semiconductor cassette. When the article 70 is transported, a flange 74 provided above the article 70 is chucked by the hoisting frame 48. The ID 76 such as RF tag or a barcode is attached to the back surface of the article 70 at a lower position. The ID data of the article 70 is written in the ID 76.

Figure 5:
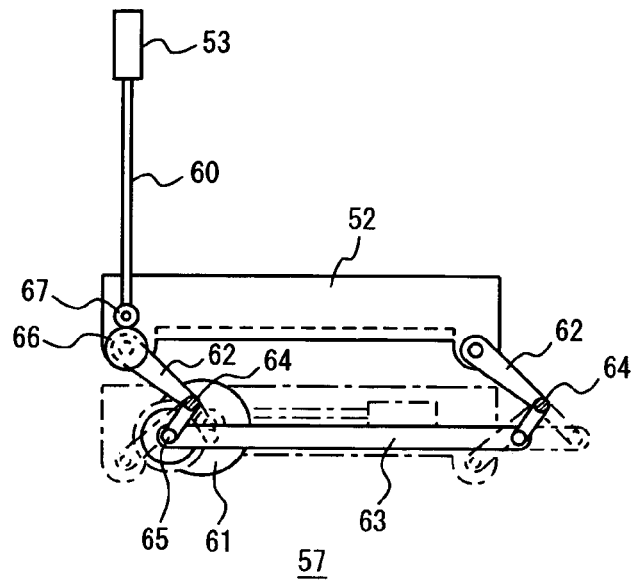
FIG. 5 is a view showing a protrusion/retraction mechanism of an ID reader according to the embodiment.

FIGS. 4 and 5 show operation of reading the ID 76 of the article 70 by the ID reader 53. It is difficult to directly read the ID 76 on the load port or the buffer. Therefore, the article 70 is chucked by the hoisting frame 48 and is pulled into the overhead traveling vehicle 20 for reading the ID 76 of the article 70. In the case of reading the ID of the article on the side buffer, the lateral feeding unit 45 moves the 0 drive 46, the elevation drive unit 47, and the hoisting frame 48 forward onto the buffer. The elevation drive unit 47 elevates or lowers the hoisting frame 48 for loading the article 70, and moves back to the original position after the article 70 is loaded. At the time of reading the ID of the article on the lower buffer or the load port, the article is moved upwardly by elevating/lowering the hoisting frame 48. Then, the ID reader 53 is rotated for reading the ID of the article.

Since the ID reader 53 obstructs the elevating/lowering route of the article 70, the ID reader 53 is retracted to the bottom of the fall prevention cover 50 when the ID reader 53 is not used for reading the ID. At the time of reading ID, the ID reader 53 is advanced to the position under the article 70. In the case where the ID 76 is an RF tag, even if the article is interposed between the ID reader 53 and the ID 76, the ID reader 53 can read the ID. Therefore, the ID reader 53 is rotated to a position just below the ID 76. In the case where the ID 76 is a barcode, the ID reader 53 is rotated, beyond a lower position on the back surface of the article 70, to a position where the ID 76 can be seen from the ID reader 53. In FIG. 5, a reference numeral 61 denotes a rotation motor, a reference numeral 62 denotes a crank, a reference numeral 63 denotes a linking arm, and a reference numeral 64 denotes a fulcrum shaft. These components are attached to a position near the bottom surface of the fall prevention cover 50. A reference numeral 65 denotes a drive shaft. When the rotation motor 61 is rotated, and the crank 62 is rotated about the fulcrum shaft 64, the fall prevention pieces 52 move between the advanced position denoted by solid lines and the retracted position denoted by chain lines. The arm 60 of the ID reader 53 moves into, and out of the fall prevention cover 50 synchronously with the fall prevention pieces 52 through gears 66, 67.

Alternatively, the ID reader 53 may move into, and out of the fall prevention cover 50 independently from the fall prevention pieces 52. Further, the position of the ID reader 53 is not limited to the bottom of the fall prevention cover 50. The ID reader 53 may be provided on the side surface of the fall prevention cover 50, at a position near the back surface of the article 70. In the embodiment, the ID reader 53 moves into, and out of the elevating/lowering route of the article. Alternatively, the ID reader 53 may move into, and out of the lateral feeding route.

The local controller issues a transportation command by designating the "From" position, the "To" position, and the ID of the article for the overhead traveling vehicle 20. The overhead traveling vehicle 20 reports the transportation result and the ID of the article to the local controller. The overhead traveling vehicle 20 has the ID reader. Therefore, when only the "From" position is designated, the overhead traveling vehicle 20 travels to the designated position, and reads the ID of the article. After reporting the ID of the article to the local controller, the overhead traveling vehicle 20 can receive data of the "To" position and travel to the "To" position. Assignment of a transportation command without data of "To position", or a transportation command with temporal data of "To" position which can be changed afterward is referred to as a reservation assignment. The reservation assignment can be made even if the ID of the article for transportation has not been determined. The reservation assignment is effective in transportation of an article that needs to be handled urgently, transportation of a plurality of articles for which the order of transportation to the load port has not been determined, or transportation by a plurality of overhead traveling vehicles for which the order of arrival to the load port is not certain, etc.

Figure 6:
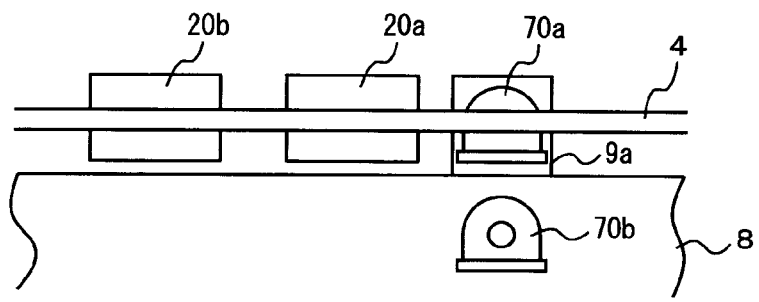
FIG. 6 is a view showing reservation assignment of the overhead traveling vehicle for an article which is transported from a load port, according to the embodiment.
Figure 7:
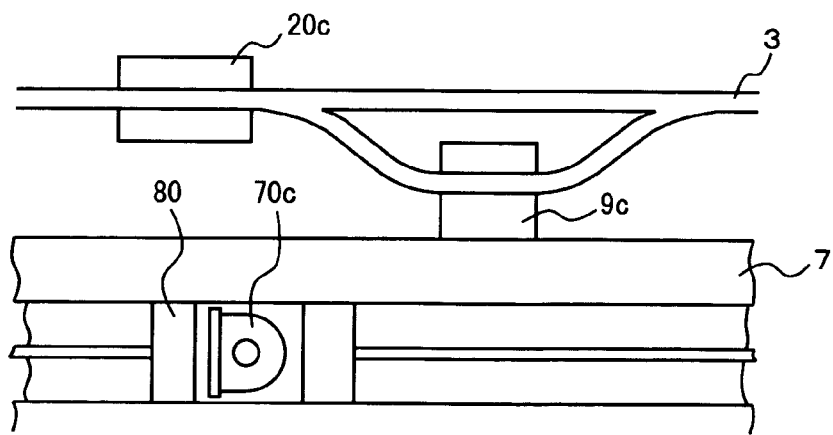
FIG. 7 is a view showing a model of reservation assignment of the overhead traveling vehicle for an article which is retrieved from a stocker.
Figure 8:
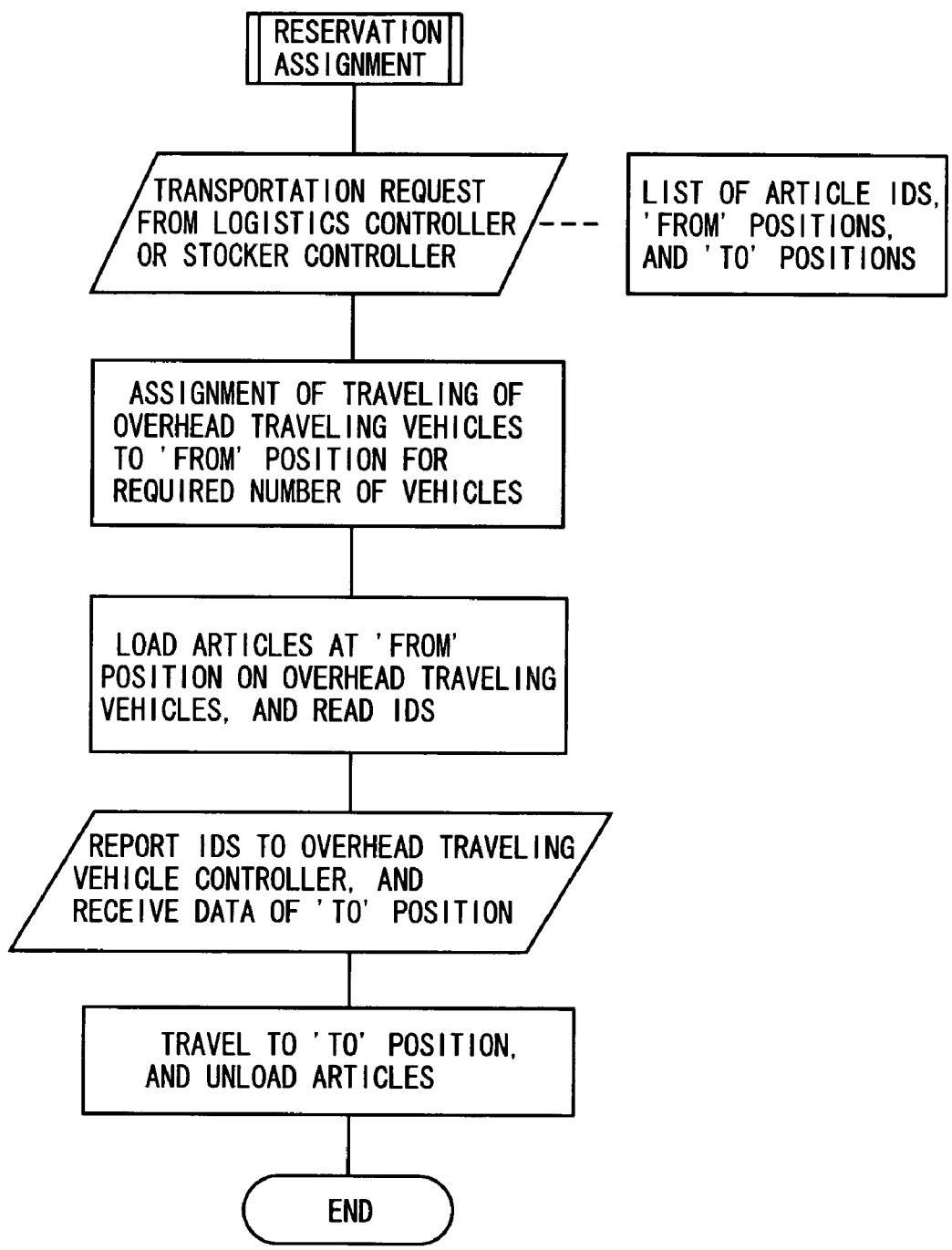
FIG. 8 is a flowchart showing an algorithm of reservation assignment according to the embodiment.

FIGS. 6 to 8 show examples of the reservation assignment. In the example of FIG. 6, articles 70a, 70b are retrieved to a load port 9a. However, there is a possibility that the order of retrieval might be changed. Therefore, a list of the IDs of the articles 70a, 70b, the "From" positions, and the "To" positions is sent from the production controller to the local controller through the logistics controller. Only the "From" position is notified to the overhead traveling vehicles 20a, 20b for requesting the overhead traveling vehicles 20a, 20b to travel toward the load port 9a. It is not certain whether the overhead traveling vehicle 20a arrives at the load port 9a first, or the overhead traveling vehicle 20b arrives at the load port 9a first. Further, it is not certain whether the article 70a is retrieved to the load port 9a first, or the article 70b is retrieved to the load port 9a first. When the overhead traveling vehicles 20a, 20b arrive at the load port 9a, the overhead traveling vehicles 20a, 20b send the read IDs of the articles, receive data of the "To" positions, and, then, transport the articles.

FIG. 7 shows the state in which a stacker crane 80 is in the middle of transporting the article 70c. The ID of the article 70c has not been confirmed. Reservation assignment is made to the overhead traveling vehicle 20c for transportation of the article 70c. When the overhead traveling vehicle 20c reads the ID of the article 70c at the load port 9c, the overhead traveling vehicle 20c report the ID to the local controller. After the overhead traveling vehicle 20c receives data of the "To" position, the overhead traveling vehicle 20c transports the article 70c.

The overhead traveling vehicle controller or the local controller has an inventory file 90 shown in FIG. 9, and manages the inventory of articles on the buffers. The ID of the buffer, information as to whether the buffer is vacant or occupied, and the ID of the article are written in the inventory file 90. Additionally, the ID of the load port at the transportation departure point for the buffer may be written in the inventory file 90. Moreover, if the load port at the transportation destination point from the buffer is known, the ID of the transportation destination point may be written in the inventory file 90. Further, information as to whether the overhead traveling vehicle for transporting the article on the buffer has been assigned or not, or information as to whether a vacant buffer has been assigned as a temporal storage or not may be written in the inventory file 90. Further, the last transportation time from/to the buffer, and the ID of the last overhead traveling vehicle which was used for transporting the article from/to the buffer, or the like may be written in the inventory file 90. Among these data, at least three data, the ID of the buffer, information as to whether the buffer is vacant or occupied, and the ID of the temporarily stored article are necessary.

By the transportation command, the ID of the article, and the transportation departure point and the transportation destination point are designated for the overhead traveling vehicle 20. When the overhead traveling vehicle 20 unloads the article on the buffer or the load port, the unloaded position and the ID of the article are reported to the local controller. Usually, the data is used for updating the inventory file 90. Further, the overhead traveling vehicle 20 performs the inventory check for the inventory file 90. In the inventory check, for example, a bay is designated, and for every buffer in the bay, it is checked whether any article is present on the buffer, and if any article is present, the ID of the article is checked.

In the embodiment, the following advantages can be obtained.

(1) It is possible to read the ID of an article without obstructing transfer of the article.

(2) Since it is possible to confirm the ID of the article for transportation, tracking of the result of executing the transportation command is simplified.

(3) Even if a trouble such as a system down or an ID failure occurs, it is possible to eliminate the trouble easily.

(4) When the overhead traveling vehicle accesses the article having an ID failure, the ID failure can be detected. The overhead traveling vehicle can travel to a predetermined load port of an inspection station or the like, and the article can be inspected.

(5) It is possible to easily carry out the inventory check of buffers.

(6) Even if a large number of buffers are provided, and the unloading destination is changed from the load port to any of the buffers in accordance with the state of the load port, no confusion occurs.

(7) Even if the order of retrieval to the load port or the like is uncertain for the article, it is possible to assign a transportation command for the article beforehand.

(8) In the case where the ID of the article is displayed on the display unit, it becomes still easier to restore the system from a system down state or the like.

The invention claimed is:

1. An overhead traveling vehicle, having a hoisting frame holding an article with an ID, and transporting the article along a traveling rail, the vehicle comprising:
    an ID reader for reading the ID;
    a moving means for moving the ID reader between an ID reading position in an article transfer route and a retracted position outside of the article transfer route, and
    a pair of covers on front and back sides of the overhead traveling vehicle in a traveling direction, the covers having fall prevention pieces for preventing the article from being dropped,
    wherein the ID reader is supported by one of the covers such that, in the retracted position, the ID reader is hidden by the one of the covers,
    wherein the ID reader is supported by the one of the covers such that, in the ID reading position, the ID reader is protruded from the one of the covers to be arranged at approximately a center position of the overhead traveling vehicle in the traveling direction, and
    wherein when the article is held by the hoisting frame and pulled into the overhead traveling vehicle, the moving means moves the ID reader to the ID reading position for reading the ID of the article.

2. An overhead traveling vehicle system comprising:
    a traveling rail, an overhead traveling vehicle adapted to travel along the traveling rail, said overhead traveling vehicle including an ID reader for reading an article with an ID and a means for moving the ID reader between an ID reading position in an article transfer route and a retracted position outside of the article transfer route;
    a load port used for transferring said article with said ID between the load port and the overhead traveling vehicle, and
    a controller for controlling the overhead traveling vehicle, said controller including a reservation assignment means for designating a transportation departure point without designating a transportation destination point, requesting the overhead traveling vehicle to travel to the transportation departure point, and notifying the overhead traveling vehicle of the transportation destination point based on reception of the ID of the article read by the overhead traveling vehicle at the transportation departure point.

3. The overhead traveling vehicle system of claim 2, wherein said controller further comprises a means for storing a list of IDs of articles, transportation departure points, and transportation destination points, and
    wherein the reservation assignment means designates the transportation departure point in the list without designating a transportation destination point, requests the overhead traveling vehicle to travel to the transportation departure point, and notifies the overhead traveling vehicle of the transportation destination point in the list based on the reception of the ID of the article read by the overhead traveling vehicle at the transportation departure point.

* * * * *